United States Patent
Cao et al.

(10) Patent No.: US 10,228,602 B2
(45) Date of Patent: Mar. 12, 2019

(54) DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yujing Cao, Beijing (CN); Song Song, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 204 days.

(21) Appl. No.: 15/320,316

(22) PCT Filed: Jan. 6, 2016

(86) PCT No.: PCT/CN2016/070269
§ 371 (c)(1),
(2) Date: Dec. 19, 2016

(87) PCT Pub. No.: WO2017/012297
PCT Pub. Date: Jan. 26, 2017

(65) Prior Publication Data
US 2017/0212398 A1 Jul. 27, 2017

(30) Foreign Application Priority Data
Jul. 20, 2015 (CN) .......................... 2015 1 0428777

(51) Int. Cl.
*G02F 1/155* (2006.01)
*G02F 1/1333* (2006.01)
(Continued)

(52) U.S. Cl.
CPC .............. *G02F 1/155* (2013.01); *B60K 35/00* (2013.01); *G02F 1/1333* (2013.01); *G02F 1/163* (2013.01);
(Continued)

(58) Field of Classification Search
CPC .......... B60K 2350/23; B60K 2350/921; B60K 2350/2091; B60K 35/00; G02F 1/1333;
(Continued)

(56) References Cited

U.S. PATENT DOCUMENTS

2013/0300654 A1* 11/2013 Seki ......................... G06F 3/013
345/156
2013/0329105 A1* 12/2013 Song ........................ H04N 5/335
348/308

(Continued)

FOREIGN PATENT DOCUMENTS

CN 102576163 A 7/2012
CN 102751312 A 10/2012
(Continued)

OTHER PUBLICATIONS

Second Chinese Office Action, for Chinese Patent Application No. 201510428777.2, dated Nov. 27, 2017, 10 pages.
(Continued)

*Primary Examiner* — Tony O Davis
(74) *Attorney, Agent, or Firm* — Kinney & Lange, P.A.

(57) ABSTRACT

Embodiments of the present disclosure provide a display panel and a display device which enable adjustment of a light transmittance. The display panel includes a plurality of sub-pixel regions arranged into an array, at least some of the sub-pixel regions each comprising a display region configured for displaying an image and a light transmitting region configured for transparent display, and the light transmitting
(Continued)

region is provided therein with a light adjusting device having an adjustable light transmittance.

12 Claims, 5 Drawing Sheets

(51) Int. Cl.
*H01L 21/77* (2017.01)
*B60K 35/00* (2006.01)
*G02F 1/163* (2006.01)
*H01L 51/00* (2006.01)
*H01L 51/52* (2006.01)
*H01L 27/32* (2006.01)

(52) U.S. Cl.
CPC .......... *H01L 21/77* (2013.01); *H01L 27/3232* (2013.01); *H01L 51/0097* (2013.01); *H01L 51/5203* (2013.01); *H01L 51/5253* (2013.01); *B60K 2350/203* (2013.01); *B60K 2350/2091* (2013.01); *B60K 2350/921* (2013.01)

(58) Field of Classification Search
CPC ......... G02F 1/155; G02F 1/163; H01L 21/77; H01L 27/3232; H01L 51/0097; H01L 51/5203; H01L 51/5253
USPC .......................................... 345/102, 589, 690
See application file for complete search history.

(56) References Cited

U.S. PATENT DOCUMENTS

| | | | | |
|---|---|---|---|---|
| 2014/0139559 | A1* | 5/2014 | Yoo | G06F 3/147 345/690 |
| 2014/0184577 | A1* | 7/2014 | Kim | G09G 5/10 345/207 |
| 2014/0185129 | A1* | 7/2014 | Kim | H01L 51/5284 359/296 |
| 2014/0355250 | A1* | 12/2014 | Tyan | G02B 5/0226 362/97.1 |
| 2015/0168776 | A1 | 6/2015 | Song et al. | |
| 2016/0156882 | A1* | 6/2016 | Nam | H04N 9/045 348/280 |
| 2017/0343804 | A1* | 11/2017 | Choi | G02B 27/0101 |
| 2018/0113510 | A1* | 4/2018 | Jentsch | G06F 3/0412 |

FOREIGN PATENT DOCUMENTS

| | | |
|---|---|---|
| CN | 103760705 A | 4/2014 |
| CN | 103985729 A | 8/2014 |
| CN | 104965338 A | 10/2015 |

OTHER PUBLICATIONS

International Search Report and Written Opinion (including English translation of Box V) dated Apr. 12, 2016, for corresponding PCT Application No. PCT/CN2016/070269.

First Chinese Office Action, for Chinese Patent Application No. 201510428777.2, dated Jun. 27, 2017, 8 pages.

* cited by examiner

DISPLAY PANEL AND DISPLAY DEVICE

CROSS-REFERENCE TO RELATED APPLICATIONS

This application claims priority to a Chinese Patent Application No. 201510428777.2, filed on Jul. 20, 2015 with the State Intellectual Property Office of China, the disclosures of which are incorporated herein by reference in their entireties.

BACKGROUND

Technical Field

The present disclosure relates to the field of display technologies, and particularly to a display panel and a display device.

Description of the Related Art

With development of the display technology, a display has been widely used in various electronic devices gradually. Diversification of the display also becomes an important characteristic of the electronic devices. Transparent display screen is a new display screen and has a certain light transmittance, so that when displaying a signal, image information may be displayed on the display screen, and when no signal is displayed, the background behind the display screen may be viewed through the display screen. Recently, a flexible and transparent display screen that is formed by a flexible substrate is also proposed based on the transparent display. The flexible and transparent display screen has characteristics including light weight, thin thickness, impact resistance, flexibility, transparence and the like, and may not only be used for common display of a graphic signal but also be mounted on a surface of a non-planar object that is needed to provide transparent display. For example, the flexible and transparent display screen may be mounted on a windshield glass of a vehicle, a transparent advertising screen or the like. As the flexible and transparent display screen further endows a transparent display screen with flexibility, the transparent display screen will be more widely used in future applications.

When using a transparent display screen, the light transmittance of the transparent display screen often needs to be adjusted according to use environment. For example, when the transparent display screen is only used for display, light emitted from the transparent display screen and nature light passing through the same both enter human eyes, which causes a contrast of an image displayed by the transparent display screen to be decreased. In this case, the light transmittance of the transparent display screen needs to be adjusted to be low. As a further example, in a case where a transparent display screen is mounted on a windshield glass of a vehicle, the light transmittance of the transparent display screen needs to be adjusted to be low when displaying, and the light transmittance will be adjusted to be high so that a better viewing field can be obtained when the vehicle is travelling. However, display device in prior art has a constant light transmittance after manufactured and is not capable of adjusting its light transmittance. Therefore, it is an urgent problem for those skilled in the art to adjust a light transmittance of a display device.

SUMMARY

Embodiments of the present disclosure provide a display panel and a display device so as to solve the problem that the light transmittance of the prior art display device is constant and cannot be adjusted after manufactured.

In order to achieve the above objects, the embodiments of the present disclosure provide the following schemes.

As a first aspect, there is provided a display panel comprising a plurality of sub-pixel regions arranged in an array, at least some of the sub-pixel regions each comprising a display region configured for displaying an image and a light transmitting region configured for transparent display, wherein the light transmitting region is provided therein with a light adjusting device having an adjustable light transmittance.

Optionally, the light adjusting device comprises an electrochromic layer, and a first transparent electrode and a second transparent electrode located on either side of the electrochromic layer, the electrochromic layer being configured to change its color under different voltages applied between the first transparent electrode and the second transparent electrode so as to adjust the light transmittance.

Optionally, respective first transparent electrodes located at one side of the electrochromic layer are portions of a unitary plate-shaped electrode, and respective second transparent electrodes located at the other side of the electrochromic layer are independent of each other.

Optionally, the display panel further comprises: at least one control circuit, and wires corresponding to the respective second transparent electrodes, the wires being located within a region outside of the display region;

each of the wires corresponding to the respective second transparent electrodes connects a corresponding second transparent electrode to the control circuit; and each control circuit is configured to control a voltage applied between a predetermined second transparent electrode and a predetermined first transparent electrode.

Optionally, projections of the second transparent electrode and the electrochromic layer are overlapped with each other in a direction of thickness of the display panel.

Optionally, the display region is provided with an electroluminescent device.

Optionally, the light transmitting region occupies 20% to 60% of the sub-pixel region.

Optionally, the light transmitting region occupies 50% of the sub-pixel region.

Optionally, the display region and the transmitting region are located closely adjacent to each other and have shapes complementary to each other.

As a second aspect, there is provided a display device comprising the display panel according to any one of the above first aspect.

The display panel and the display device according to the embodiments of the present disclosure include a plurality of sub-pixel regions arranged into an array, at least some of the sub-pixel regions each comprising a display region configured for displaying an image and a light transmitting region configured for transparent display, wherein the light transmitting region is provided with a light adjusting device having an adjustable light transmittance. With the embodiments of the present disclosure, the light transmittance of the display panel can be adjusted through the light adjusting device, thereby achieving adjustment of the light transmittance of the display panel.

BRIEF DESCRIPTION OF THE DRAWINGS

In order to more clearly indicate the technical schemes in embodiments of the present disclosure or in prior arts, drawings that are used to illustrate the technical schemes in the embodiments or in prior arts will be introduced simply. Obviously, the drawings described in the following are merely some embodiments of the present disclosure. However, it is obvious for those skilled in the art to obtain other drawings based on the disclosed drawings without inventive labor.

DETAILED DESCRIPTION OF THE EMBODIMENTS

Figure 1:
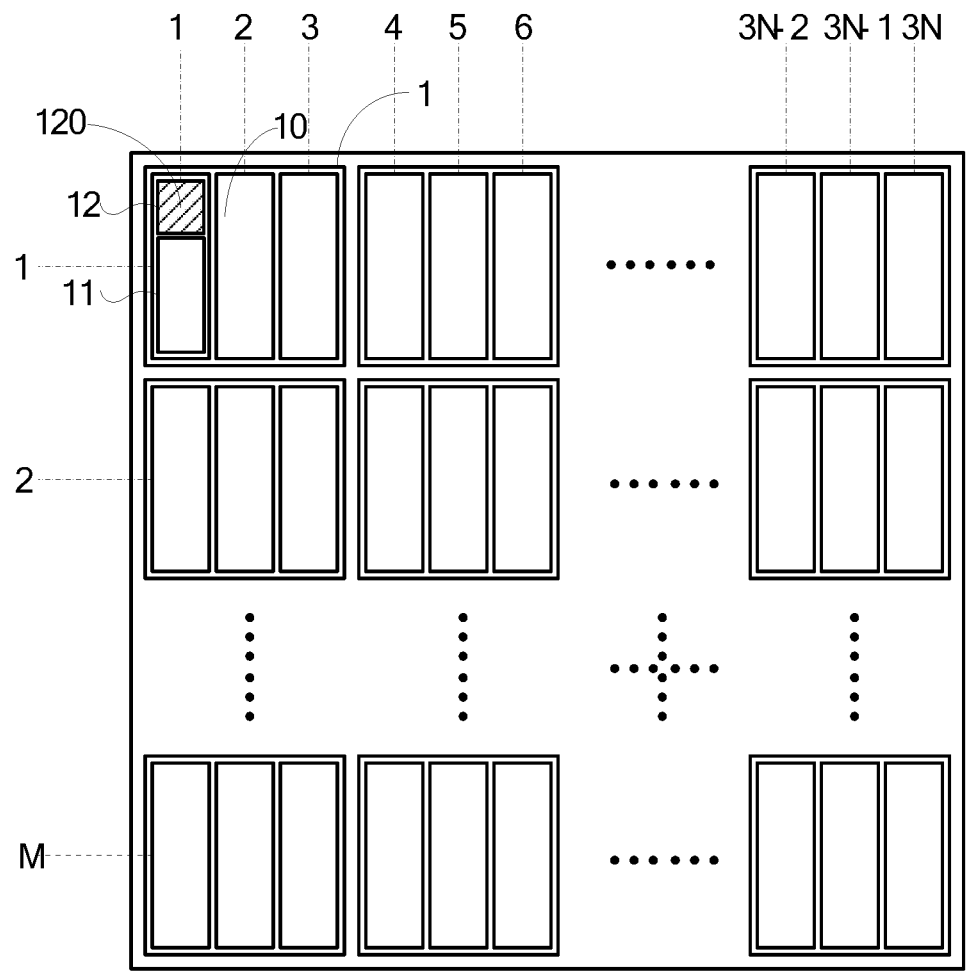
FIG. 1 is a schematic structural view of a display panel according to an embodiment of the present disclosure.

A clear and complete description of the schemes according to embodiments of the present disclosure will be made as below with reference to the accompanying drawings. Obviously, the embodiments described are merely parts, instead of all, of embodiments of the present disclosure. Any embodiments that are obtained based on the embodiments of the present disclosure by those skilled in the art without inventive labor will fall into protective scopes of the present invention.

It is noted that, in order to more clearly describe schemes of the embodiments of the present disclosure, terms such as "first", "second" and the like are used to distinguish components or items with the same or similar function and purpose, and it will be understood by those skilled in the art that they are not intended to limit the quantity and operation order. In addition, wordings such as "upper" and "lower" are defined by an order of manufacturing an array substrate, such as, an upper pattern is defined relative to a pattern that is formed posteriorly, and a lower pattern is defined relative to a pattern that is formed anteriorly.

Considering actual practice situations, a display panel that may be used for transparent display includes: a display region configured for displaying an image and a light transmitting region configured for transparent display. Human eyes may view an item or presentation on the item placed behind the display panel through the light transmitting region while watching an image displaying on the display region. In a situation where a light transmittance of the light transmitting region is relatively high, the display performance of the display panel is degraded by the relatively high light transmittance, although the item placed behind the display panel may be viewed. In addition, when viewing an item placed behind the light transmitting region, a highlight transmittance of the light transmitting region is required as a user might wish to clearly see specific detail of the item, and, sometime a lowlight transmittance is not required as a user might not need to clearly see specific detail of the item. Embodiments of the present disclosure provide a display panel which enables adjustment of the light transmittance of the light transmitting region, such that the light transmittance of the light transmitting region can be adjusted according to requirements of a user when performing the image display and transparent display simultaneously.

An embodiment of the present disclosure provides a display panel. Specifically, referring to FIG. 1, the display panel includes: a plurality of sub-pixel regions 10 arranged into an array, at least some of the sub-pixel regions each comprising a display region 11 configured for displaying an image and a light transmitting region 12 configured for transparent display, wherein the light transmitting region 12 is provided therein with a light adjusting device 120 having an adjustable light transmittance.

Optionally, each of the sub-pixel regions may be provided with the light adjusting device 120. Alternatively, some of the sub-pixel regions may each be provided with the light adjusting device 120.

Specifically, referring to FIG. 1, the display panel generally includes pixel regions 1 arranged into an array. The pixel region 1 generally includes several sub-pixels configured to display different colors. For example, a pixel or pixel region may include four sub-pixels, i.e., a red sub-pixel (R), a green sub-pixel (G), a blue sub-pixel (B), and a white sub-pixel (W). Of course, a pixel may include sub-pixels in other numbers and colors, which is not limited herein. Projection region of the sub-pixel on the display panel is called as a sub-pixel region. FIG. 1 shows an example where a pixel includes three sub-pixels and a display panel includes M×3N sub-pixel regions 10 arranged into an array for illustration.

Exemplarily, when the display panel is a liquid crystal display panel, the display region includes at least a common electrode, a pixel electrode, a field effect thin film transistor (TFT) and the like. When the display panel is an electroluminescent display panel, the display region includes at least an electroluminescent device, a drive circuit and the like.

In the display panel shown in FIG. 1, which is used for transparent display, its sub-pixel regions each is provided with a display region and a light transmitting region, and a light adjusting device that has an adjustable light transmittance is provided within the light transmitting region. Thus, when a user is viewing an item that has specific details and is located behind the display panel, the light transmittance of the light transmitting region can be adjusted by adjusting the light adjusting device of the display panel such that the user may see the specific details of the item clearly. When the user requires a relatively high display quality for the display panel, the light adjusting device of the display panel may be adjusted to reduce the light transmittance of the light transmitting region. In this way, a contrast of the display region for displaying an image may be increased and the display quality of the display region may be enhanced. As such, the light transmittance of the light transmitting region of the display panel may be dynamically adjusted according to requirements from the user.

When implemented, the display panel may be operated in a plurality of operation modes, each of which corresponds to a different light transmittance of the light transmitting region. The user may switch the operation mode of the display panel according to actual requirements. Or, the operation mode of the display panel may be determined depending on the displayed content on the display region. For example, when the display region displays an image, the light transmittance of the light transmitting region of the display panel may be reduced; or, when the display region displays characters, the light transmittance of the light transmitting region of the display panel may be increased such that a better viewing effect of the item can be obtained obtain through the light transmitting region.

Optionally, the light adjusting device may be an electrochromic device.

Figure 2:
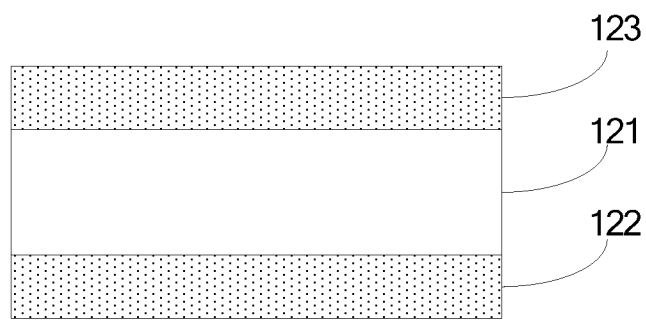
FIG. 2 is a schematic structural view of an electrochromic device according to an embodiment of the present disclosure.

Specifically, referring to FIG. 2, the light adjusting device 120 that is provided in the light transmitting region is an electrochromic device. The light adjust device 120 includes an electrochromic layer 121, and a first transparent electrode 122 and a second transparent electrode 123 that are located on either side of the electrochromic layer 121.

Here, the electrochromic device is directed to a device that is made of an electrochromic material. Generally, a electrochromic device includes a positive electrochromic device and a negative electrochromic device, where the positive electrochromic device is directed to an electrochromic device which has a higher light transmittance when no voltage is applied thereon and has a lower light transmittance when a voltage is applied thereon; and the negative electrochromic device is directed to an electrochromic device which has a lower light transmittance when no voltage is applied thereon and has a higher light transmittance when a voltage is applied thereon.

The following embodiments of the present disclosure will be described by referring a positive electrochromic device as the light adjusting device.

In practice, when the light transmittance of the light adjusting device is needed to be adjusted, the voltages applied to the first transparent electrode 122 and the second transparent electrode 123 that are located on either side of the electrochromic layer 121 may be adjusted such that the electrochromic layer 121 is changed to into different colors under different electric fields. As the electrochromic layer has different light shielding effects when having different colors, the adjustment of the light transmittance of the light transmitting region may be achieved.

Exemplarily, the light adjusting device may also be a light adjusting film, which includes two transparent conductive layers and a liquid crystal/polymer mixture material filled between the two transparent conductive layers. In a situation where no electric filed is applied, the light adjusting film is in a transparent state; and, when an electric field is applied, liquid molecules are deflected. As the deflection degree of the liquid molecules varies depending on the applied electrical field, the light shielding effect may be changed. The light transmittance of the light transmitting region may thus be adjusted by adjusting the electric filed (voltage) applied to the light adjusting film that is provided in the light transmitting region.

The above are merely two possible implementations of embodiments of the present disclosure. The light adjusting device may further be other device that has a similar property and will not be listed one by one. In addition, it is noted that the light adjusting device has a rather high light transmittance when no voltage is applied and light may pass through the display panel through the electroluminescent device. For this reason, a display panel through which the light passes is named as a transparent display panel and a display device including this display panel is named as a transparent display device.

Figure 3:
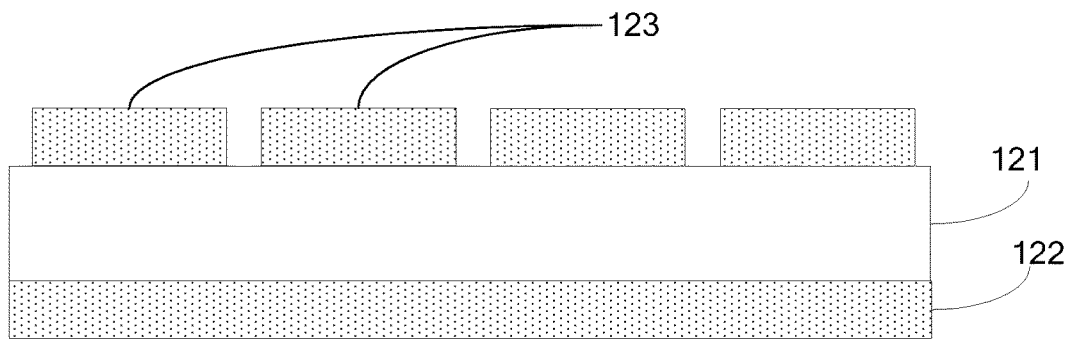
FIG. 3 is a schematic structural view of another electrochromic device according to an embodiment of the present disclosure.
Figure 4:
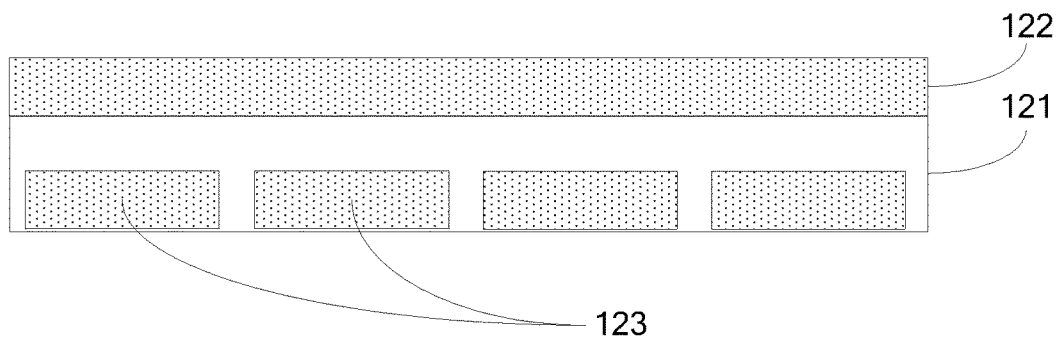
FIG. 4 is a schematic structural view of a further electrochromic device according to an embodiment of the present disclosure.

Further, referring to FIGS. 3 and 4, respective first transparent electrodes 122 located at one side of the electrochromic layer are portions of a unitary plate-shaped electrode; respective second transparent electrodes 123 located at the other side of the electrochromic layer are independent of each other. The "portions of a unitary plate-shaped electrode" means that one plate-shaped electrode is shared to a plurality of electrochromic layers and the plate-shaped electrode covers all the electrochromic layers in a vertical direction.

With this configuration, as the second transparent electrodes corresponding to respective electrochromic layers are independent of each other (that is, not electrically connected with each other), it is possible to apply a voltage to the plate-shape electrode corresponding to the electrochromic layers and to apply different voltages to the respective second transparent electrodes such that the light transmittance of the respective electrochromic devices may be control individually. That is, it is possible to flexibly control the light transmittances of light transmitting regions of different sub-pixels.

In addition, compared to a configuration where both the first transparent electrodes and the second transparent electrodes are independent of each other, the first transparent electrodes in the embodiments of the present disclosure may be obtained by depositing a film of transparent conductive material with a suitable thickness without a further photolithographic process for etching the film of transparent conductive material, thereby simplifying manufacturing processes of the electrochromic device.

Optionally, if the light transmittances of the electrochromic devices are needed to be uniform, the second transparent electrodes may be configured to be in electrical connection with each other, or a common plate-shaped electrode may be provided for the respective electrochromic layers.

FIG. 3 illustrates an example where the first transparent electrode 122 is located under the electrochromic layer 121 and the second transparent electrode 123 is located above the electrochromic layer 121. FIG. 4 illustrates an example where the first transparent electrode 122 is located above the electrochromic layer 121 and the second transparent electrode 123 is located under the electrochromic layer 121.

Exemplarily, the first transparent electrode and the second transparent electrode may be made of Indium tin oxide (ITO). Optionally, the first transparent electrode and the second transparent electrode may be made of other materials with a good conductivity and a high light transmittance, such as graphene.

In an embodiment, the display panel may further comprise: at least one control circuit, and wires corresponding to respective second transparent electrodes (i.e., a plurality of wires that respectively connect a respective one of the second transparent electrodes with the control circuit), the wires being located within a region outside of the display region;

in an example, each of the wires corresponding to the respective second transparent electrodes connects the corresponding second transparent electrode to the control circuit, and each control circuit is configured to control a voltage applied between a predetermined second transparent electrode and a predetermined first transparent electrode.

Exemplarily, there may be provided wires connecting the first transparent electrodes and the control circuit, and the control circuit is configured to, via the wires, apply a voltage to the first transparent electrodes, and to apply same or different voltages to the respective second transparent electrodes.

Exemplarily, the wires corresponding to the respective second transparent electrodes may be made of a transparent conductive material, such as ITO or graphene. In addition, the wires corresponding to the respective second transparent electrodes may also be made of a metal conductive material. When the wires are made of a metal conductive material, the wires are themselves non-transparent and thus are arranged with a region outside of the display region so that normal display of the display panel can be prevented from being affected by the wires.

Embodiments of the present disclosure will be described with reference to display panels which respectively include one, two, or four control circuits and each control circuit includes a low-voltage power supply.

Figure 5:
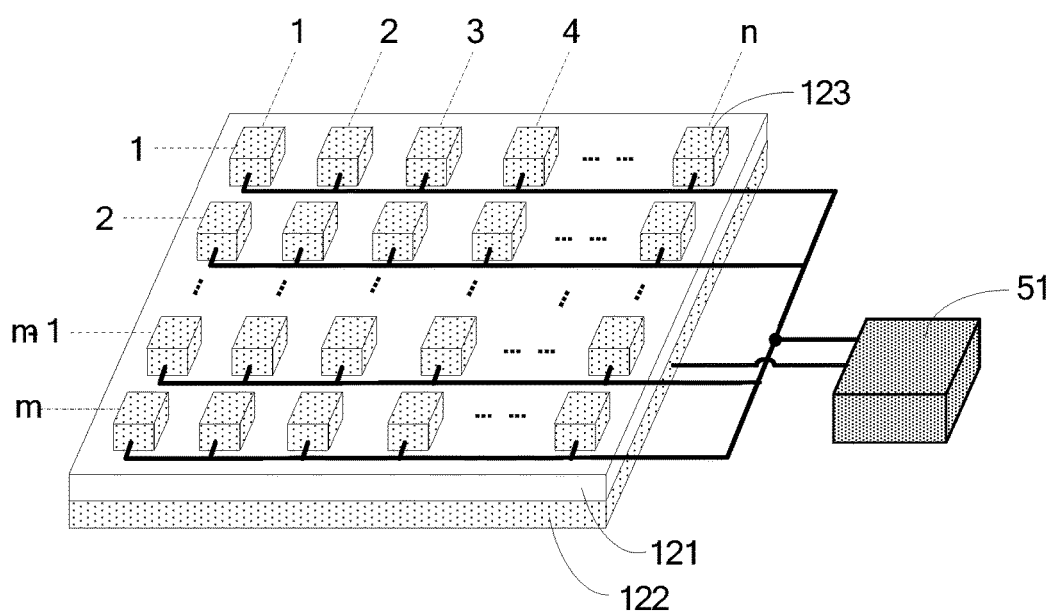
FIG. 5 is a schematic structural view of a display panel including a control circuit according to an embodiment of the present disclosure.

Exemplarily, referring to FIG. 5, for illustration of embodiments of the present disclosure, there is shown an example in which a display panel includes one control circuit 51, first transparent electrodes of respective electrochromic devices are portions of a unitary plate-shaped electrode and second transparent electrodes are independent of each other. In this example, the display panel includes m×n sub-pixel regions, a first electrode of a power supply of the control circuit 51 is electrically connected with the first transparent electrodes, and a second electrode of the power supply of the control circuit 51 is electrically connected with the second transparent electrodes via the wires corresponding to the respective second transparent electrodes. In the embodiment shown in FIG. 5, all the electrochromic devices are simultaneously connected to the control circuit and the second transparent electrodes are electrically connected to each other. In this way, all the electrochromic devices can be simultaneously controlled by only one control circuit, so as to adjust the light transmittance of the display panel in the same magnitude.

Figure 6:
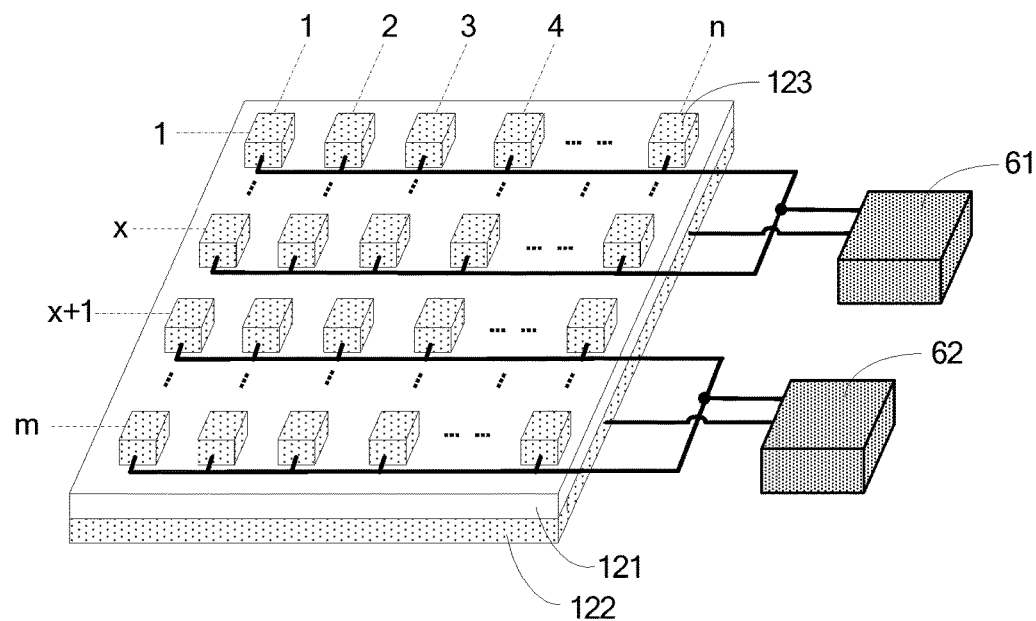
FIG. 6 is a schematic structural view of a display panel including two control circuits according to an embodiment of the present disclosure.

Exemplarily, referring to FIG. 6, for illustration of embodiments of the present disclosure, there is shown an example in which a display panel includes a first control circuit 61 and a second control circuit 62, first transparent electrodes 122 of respective electrochromic devices are portions of a unitary plate-shaped electrode and second transparent electrodes 123 are independent of each other. The display panel includes m×n sub-pixels, a first electrode of a power supply of the first control circuit 61 is electrically connected with the first transparent electrodes 122 of the respective electrochromic devices, and a second electrode of the power supply of the first control circuit 61 is electrically connected with the second transparent electrodes 123 of the electrochromic device of the sub-pixel regions located in rows 1 to X; and a first electrode of a power supply of the second control circuit 62 is electrically connected with the first transparent electrodes 122 of the respective electrochromic devices, and a second electrode of the power supply of the second control circuit 62 is electrically connected with the second transparent electrodes 123 of the electrochromic devices of the sub-pixel regions located in rows X+1 to m, where m>x+1. The electrochromic devices located within different regions, for example, the electrochromic devices of the sub-pixel regions located in rows 1 to X and the electrochromic devices of the sub-pixel regions located in rows X+1 to m, may be respectively controlled by two control circuits such that the electrochromic devices located within two regions may simultaneously have different light transmittances, thereby achieving more flexible control of the light transmittances of different light transmitting regions.

Figure 7:
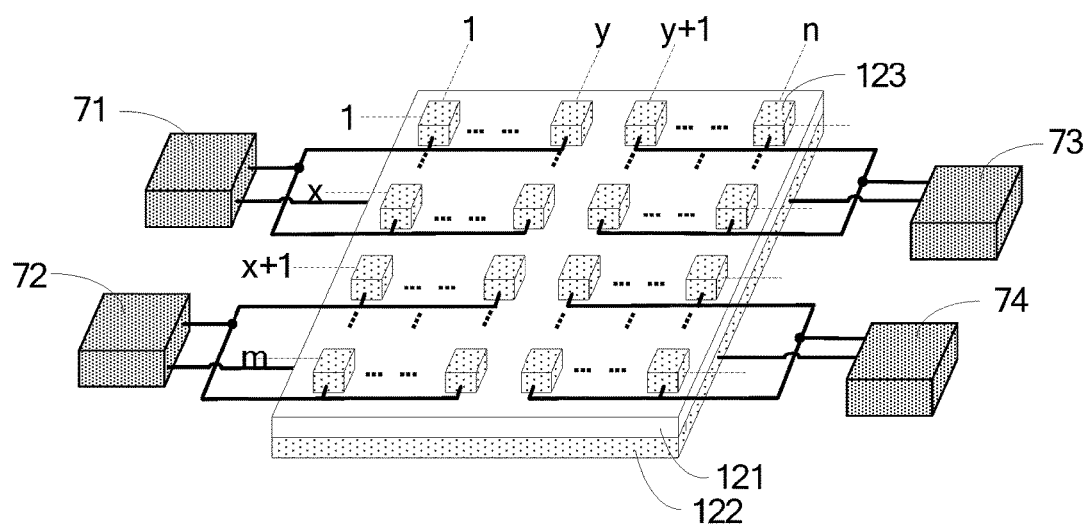
FIG. 7 is a schematic structural view of a display panel including four control circuits according to an embodiment of the present disclosure.

Further exemplarily, referring to FIG. 7, for illustration of embodiments of the present disclosure, there is shown an example in which a display panel includes a first control circuit 71, a second control circuit 72, a third control circuit 73, and a fourth control circuit 74, first transparent electrodes 122 of respective electrochromic devices are portions of a unitary plate-shaped electrode and second transparent electrodes 123 are independent of each other. The display panel includes m×n sub-pixels, a first electrode of a power supply of the first control circuit 71 is electrically connected with the first transparent electrodes 122 of the respective electrochromic devices, and a second electrode of the power supply of the first control circuit 71 is electrically connected with the second transparent electrodes 123 of the electrochromic device of the sub-pixel regions located in rows 1 to X and columns 1 to y; a first electrode of a power supply of the second control circuit 72 is electrically connected with the first transparent electrodes 122 of the respective electrochromic devices, and a second electrode of the power supply of the second control circuit 72 is electrically connected with the second transparent electrodes 123 of the electrochromic devices of the sub-pixel regions located in rows X+1 to m and columns 1 to y; a first electrode of a power supply of the third control circuit 73 is electrically connected with the first transparent electrodes 122 of the respective electrochromic devices, and a second electrode of the power supply of the third control circuit 73 is electrically connected with the second transparent electrodes of the electrochromic devices of the sub-pixel regions located in rows 1 to X and columns y to n; a first electrode of a power supply of the fourth control circuit 74 is electrically connected with the first transparent electrodes 122 of the respective electrochromic devices, and a second electrode of the power supply of the fourth control circuit 74 is electrically connected with the second transparent electrodes 123 of the electrochromic device of the sub-pixel regions located in rows x+1 to m and columns y+1 to n. When four control circuits are provided for the electrochromic devices, the electrochromic devices may be controlled in four regions, thereby further achieving diversified control of the electrochromic devices.

It is noted that the control circuit(s) provided in the above embodiments are possible implementations according to embodiments of the present disclosure, but are not intended to limit the present disclosure. Control circuit of an embodiment of the present disclosure may also be achieved by other type of control circuit. For example, the electrochromic device may be controlled through a shift register circuit. In addition, the number of the control circuits in embodiments of the present disclosure may be not limited to one, two or four, and more control circuits may be included. As the number of the control circuits is increased, the regions where the electrochromic device may be individually controlled will also be increased, and thus the display performance of the display panel can be improved and the display panel may perform more functions.

Preferably, projections of the second transparent electrode 123 and the electrochromic layer 121 are overlapped with each other in a direction of thickness of the display panel, and the second transparent electrode 123 does not cover any circuit structure within the sub-pixel region.

Figure 8:
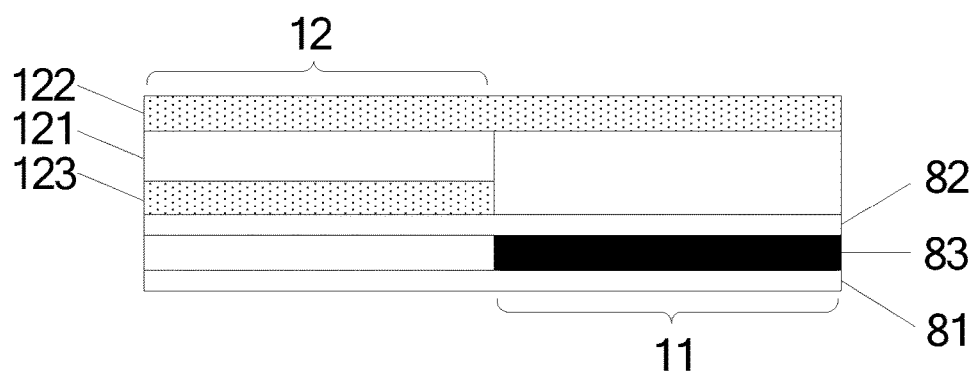
FIG. 8 is a cross sectional view showing a vertical cross section of a display panel according to an embodiment of the present disclosure.

Exemplarily, referring to FIG. 8, which is a cross sectional view showing a vertical cross section of a display panel, the display panel includes a first substrate 81 located at bottom of the display panel, and a second substrate 82 and TFT 83 located below the second transparent electrode 123. Projections of the second transparent electrode 123 and the electrochromic layer 121 are overlapped with each other in a direction of thickness of the display panel. The second transparent electrode 123 is located below the electrochromic layer 121 and the first transparent electrode 122 is located above the electrochromic layer. Projections of the second transparent electrode 123 and the electrochromic layer 121 do not cover the display region in the direction of thickness of the display panel, i.e., the second transparent electrode and the electrochromic layer are located within an opening region of sub-pixel region and do not cover the circuit structure of the sub-pixel region. Specifically, when the display panel is a liquid crystal display panel, the second transparent electrodes do not cover any circuit structure such as TFT of the sub-pixel region. When the display panel is an organic light emitting diode display panel, the second transparent electrodes do not cover any circuit structure such as a drive circuit of the display panel.

As described above, as the second transparent electrode and the electrochromic layer are located within an opening region of sub-pixel region, adverse influence of the electrochromic device on normal display of the display panel may be avoided. In addition, if the projections of the second transparent electrode 123 and the electrochromic layer 121 are not overlapped with each other in the direction of thickness of the display panel, a part of one of the second transparent electrode 123 and the electrochromic layer 121 in excess of the other may not be used to adjust the light transmittance of the display panel and may further degrade an aperture ratio of the display panel, regardless of whether an area of the second transparent electrode is greater than that of the electrochromic layer or the area of electrochromic layer is greater than that of the second transparent electrode. For the reasons, the second transparent electrode 123 and the electrochromic layer 121 are configured such that their projections are overlapped with each other in the direction of thickness of the display panel.

Figure 9:
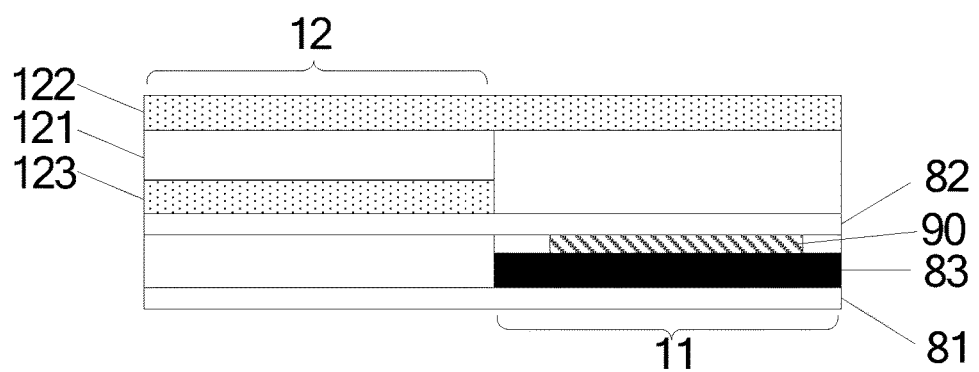
FIG. 9 is a cross sectional view showing a vertical cross section of another display panel according to an embodiment of the present disclosure.

Exemplarily, referring to FIG. 9, the display panel is a flexible display panel and an electroluminescent device 90 is provided within the display region.

FIG. 9 is a cross sectional view showing a vertical cross section of the display panel. The display panel includes a first substrate 81 located at bottom of the display panel, and a second substrate 82 and a TFT 83 located below a second transparent electrode 123. The electroluminescent device 90 is located above the TFT device. The electroluminescent (EL) device is directed to a display device that is made of an electroluminescent material to emit light under excitation. A common electroluminescent material may be an organic luminescent material. A display device that is manufactured from the organic luminescent material is an organic light emitting display device. As it is not necessary for an organic light emitting display device to be equipped with any backlight plate, compared with a liquid crystal display device, the organic light emitting display device may be attached with a protective film on a rear face of the display panel by means of a film packaging technology such that the display panel becomes flexible and is difficult to be broken. The display panel according to embodiments of the present disclosure may be a flexible display panel. Embodiments of the present disclosure may be applied in the field of flexible display technologies.

Exemplarily, the light transmitting region may occupy 20%-60% of the sub-pixel region.

Exemplarily, the light transmitting region may occupy 50% of the sub-pixel region.

In practice, when a high display performance is required for the display panel, a percentage of the light transmitting region relative to the sub-pixel region will be set to be relatively small. For example, the light transmitting region may occupy 20% of the sub-pixel region. When a relative good light transmitting effect is required for the display panel, the percentage of the light transmitting region to the sub-pixel region will be set to be relatively high. For example, the light transmitting region may occupy 60% of the sub-pixel region. Specifically, a ratio of an area of the light transmitting region to that of the display region may be determined according to actual situations. In addition, a configuration where the light transmitting region occupies 50% of the sub-pixel region may enable a more uniform distribution of the display regions and the light transmitting regions in the display panel so that a balance between the display effect and light transmitting effect of the display panel can be obtained.

Figure 10:
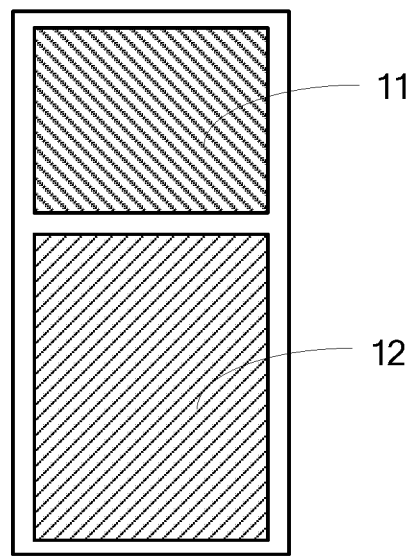
FIG. 10 is a schematic view showing shapes of a display region and a light transmitting region according to an embodiment of the present disclosure.

Further, as shown in FIG. 10, the display region 11 and the light transmitting region 12 may each have a regular shape, and may be located closely adjacent to each other and complementary to each other in shape. Specifically, if the sub-pixel region has a rectangle shape, the display region 11 and the light transmitting region 12 may also have a rectangle shape. Alternatively, the display region has a rectangle shape and the light transmitting region is a loop surrounding the rectangle.

Figure 11:
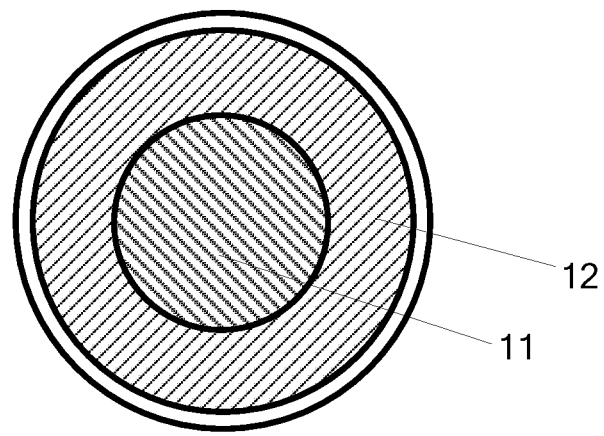
FIG. 11 is a schematic view showing shapes of another display region and another light transmitting region according to an embodiment of the present disclosure.

In addition, as shown in FIG. 11, when the sub-pixel region has a circular shape, the display region 11 may be configured as a circular region located within the sub-pixel region and the light transmitting region 12 may be configured as a ring region which adjoins to the periphery of the display region 11.

The shapes of the display region and the light transmitting region according to the present disclosure may be configured as any shape according to actual requirements. Any other embodiments obtained by those skilled in the art without inventive labor fall within protective scopes of the present disclosure.

A further embodiment of the present disclosure provides a display device comprising the display panel provided according to any of the above embodiments.

In addition, the display device may be an electronic paper, a mobile phone, a tablet computer, a television, a display, a notebook computer, a digital photo frame, a navigator or other product or component that has a display function.

The display device provided according to the embodiment of the present disclosure includes a plurality of sub-pixel regions arranged into an array, at least some of the sub-pixel regions each comprising a display region configured for displaying an image and a light transmitting region configured for transparent display, wherein the light transmitting region is provided with a light adjusting device which has an adjustable light transmittance. Thus, with the embodiment of the present disclosure, the light transmittance of the display panel may be adjusted by the light adjusting device, thereby achieving adjustment of the light transmittance of the display panel.

The above described contents are merely preferred embodiments of the present disclosure, and not intended to limit the present disclosure. Any modification, substitution and improvement made within the spirit and principle of the present disclosure shall be included in the protective scope of the present invention. Thus, the protective scope of the present invention should be defined by the claims.

What is claimed is:

1. A display panel comprising a plurality of sub-pixel regions arranged in an array, at least some of the sub-pixel regions each comprising a display region configured for displaying an image and a light transmitting region configured for transparent display, wherein the light transmitting region is provided therein with a light adjusting device having an adjustable light transmittance,
   wherein the light adjusting device comprises an electrochromic layer, and a first transparent electrode and a second transparent electrode located on first and second opposite sides of the electrochromic layer, the electrochromic layer being configured to change its color under different voltages applied between the first transparent electrode and the second transparent electrode so as to adjust the light transmittance, and
   wherein the respective first transparent electrodes located at the first side of the electrochromic layer are portions of a unitary plate-shaped electrode, and respective second transparent electrodes located at the second side of the electrochromic layer are independent of each other, and wherein projections of the second transparent electrode and the electrochromic layer coincide with each other in a direction of thickness of the display panel.

2. The display panel according to claim 1,
   wherein the display panel further comprises: at least one control circuit, and wires corresponding to the respective second transparent electrodes, the wires being located within a region outside of the display region; and
   wherein each of the wires corresponding to the respective second transparent electrodes connects a corresponding second transparent electrode to the control circuit; and each control circuit is configured to control a voltage applied between a predetermined second transparent electrode and a predetermined first transparent electrode.

3. The display panel according to claim 1, wherein the display panel is a flexible display panel and the display region is provided with an electroluminescent device.

4. The display panel according to claim 1, wherein the light transmitting region occupies 20% to 60% of the sub-pixel region.

5. The display panel according to claim 4, wherein the light transmitting region occupies 50% of the sub-pixel region.

6. The display panel according to claim 1, wherein the display region and light the transmitting region are located closely adjacent to each other and have shapes complementary to each other.

7. A display device, comprising the display panel according to claim 1.

8. The display device according to claim 7, wherein the display panel further comprises:
   at least one control circuit, and wires corresponding to the respective second transparent electrodes, the wires being located within a region outside of the display region; and
   wherein each of the wires corresponding to the respective second transparent electrodes connects a corresponding second transparent electrode to the control circuit; and each control circuit is configured to control a voltage applied between a predetermined second transparent electrode and a predetermined first transparent electrode.

9. The display device according to claim 7, wherein the display panel is a flexible display panel and the display region is provided with an electroluminescent device.

10. The display device according to claim 7, wherein the light transmitting region occupies 20% to 60% of the sub-pixel region.

11. The display device according to claim 10, wherein the light transmitting region occupies 50% of the sub-pixel region.

12. The display device according to claim 7, wherein the display region and the light transmitting region are located closely adjacent to each other and have shapes complementary to each other.

* * * * *